(12) United States Patent
Lahoda et al.

(10) Patent No.: US 11,043,308 B2
(45) Date of Patent: Jun. 22, 2021

(54) DUPLEX ACCIDENT TOLERANT COATING FOR NUCLEAR FUEL RODS

(71) Applicants: WESTINGHOUSE ELECTRIC COMPANY, LLC, Cranberry Township, PA (US); WISCONSIN ALUMNI RESEARCH FOUNDATION, Madison, WI (US)

(72) Inventors: Edward J. Lahoda, Edgewood, PA (US); Peng Xu, Columbia, SC (US); Robert Oelrich, Columbia, SC (US); Kumar Sridharan, Madison, WI (US); Benjamin Maier, Waunakee, WI (US); Greg Johnson, Madison, WI (US)

(73) Assignee: Westinghouse Electric Company LLC, Cranberry Township, PA (US)

( * ) Notice: Subject to any disclaimer, the term of this patent is extended or adjusted under 35 U.S.C. 154(b) by 327 days.

(21) Appl. No.: 15/722,167

(22) Filed: Oct. 2, 2017

(65) Prior Publication Data

US 2018/0096743 A1 Apr. 5, 2018

Related U.S. Application Data

(60) Provisional application No. 62/403,304, filed on Oct. 3, 2016.

(51) Int. Cl.
*G21C 3/07* (2006.01)
*C23C 14/16* (2006.01)
(Continued)

(52) U.S. Cl.
CPC ............... *G21C 3/07* (2013.01); *C23C 14/16* (2013.01); *C23C 14/34* (2013.01); *C23C 24/08* (2013.01);
(Continued)

(58) Field of Classification Search
CPC ...... C23C 28/021; C23C 28/023; C23C 14/34; C23C 24/08; C23C 24/087; G21C 3/20; G21C 3/07
See application file for complete search history.

(56) References Cited

U.S. PATENT DOCUMENTS

| 5,302,414 | A |   | 4/1994 | Alkhimov et al. |
| 5,787,136 | A | * | 7/1998 | Miyazaki ............ C22C 32/0047 376/219 |

(Continued)

FOREIGN PATENT DOCUMENTS

| JP | 2006219740 A | 8/2006 |
| KR | 10-1393327 B1 | 5/2014 |
| WO | 2016/042262 A1 | 3/2016 |

OTHER PUBLICATIONS

US 8,792,605 B2, 07/2014, Kim et al. (withdrawn)
(Continued)

*Primary Examiner* — Lily C Garner
(74) *Attorney, Agent, or Firm* — K&L Gates LLP

(57) ABSTRACT

A method is described for forming duplex layers including an interlayer and a corrosion resistant boundary layer on a nuclear fuel rod cladding tube for use in a water cooled nuclear reactor. The method includes forming, by thermal deposition or physical vapor deposition, on the exterior of a substrate, an inner interlayer with Mo, Ta, W or Nb or other particles, and forming, by thermal deposition or physical vapor deposition, on the interlayer, an outer corrosion resistant layer with particles selected from the group consisting of Cr, a Cr alloy, and combinations thereof. The interlayer prevents eutectic formation between the corrosion resistant layer and the substrate.

13 Claims, 1 Drawing Sheet

(51) Int. Cl.
*C23C 28/02* (2006.01)
*C23C 24/08* (2006.01)
*C23C 14/34* (2006.01)
*G21C 3/20* (2006.01)

(52) U.S. Cl.
CPC .......... *C23C 24/087* (2013.01); *C23C 28/021* (2013.01); *C23C 28/023* (2013.01); *G21C 3/20* (2013.01); *Y02E 30/30* (2013.01)

(56) References Cited

U.S. PATENT DOCUMENTS

| | | | | |
|---|---|---|---|---|
| 6,500,326 | B1* | 12/2002 | Warnecke | C23C 28/021 |
| | | | | 205/118 |
| 8,675,809 | B2 | 3/2014 | Lahoda et al. | |
| 2004/0037954 | A1* | 2/2004 | Heinrich | C23C 24/04 |
| | | | | 427/180 |
| 2010/0040189 | A1* | 2/2010 | Brachet | C22C 16/00 |
| | | | | 376/419 |
| 2012/0148769 | A1* | 6/2012 | Bunker | B23P 15/04 |
| | | | | 428/34.1 |
| 2013/0344348 | A1 | 12/2013 | Koo et al. | |
| 2014/0241485 | A1 | 8/2014 | Di Fonzo et al. | |
| 2014/0254740 | A1 | 9/2014 | Ledford et al. | |
| 2015/0050521 | A1 | 2/2015 | Le Flem et al. | |
| 2015/0283792 | A1* | 10/2015 | Aitchison | B22F 5/10 |
| | | | | 428/636 |
| 2015/0348652 | A1* | 12/2015 | Mazzoccoli | G21C 21/16 |
| | | | | 376/409 |
| 2017/0287578 | A1* | 10/2017 | Brachet | C23C 14/3485 |
| 2018/0254110 | A1* | 9/2018 | Ledford | G21C 3/07 |

OTHER PUBLICATIONS

Karthikeyan, J. "The advantages and disadvantages of the cold spray coating process." The cold spray materials deposition process. Woodhead Publishing, 2007. 62-71. (Year: 2007).*
International Search Report and Written Opinion of the International Searching Authority for PCT/US2017/054697 dated Apr. 27, 2018 (PCT/ISA/220, PCT/ISA/210, PCT/ISA/237).
A. Moridi; Cold Spray Coating: Review of Material Systems and Future Perspective; Surface Engineering, 2014, pp. 369-395; vol. 36.
K. Sridharan; Cold Spray Materials Deposition Technology; Power Point Presentation, International Thermal Spray Conference; 2012; Department of Engineering Physics, University of Wisconsin-Madison.
R.W. Smith; Plasma Spray Deposition: A Need for Direct Process Control; pp. 1169-1183; Drexel University, Philadelphia, PA (Publication date unknown).
An Introduction of Thermal Spray; Oerlikon Metco; Nov. 2015; Issue 6.

* cited by examiner

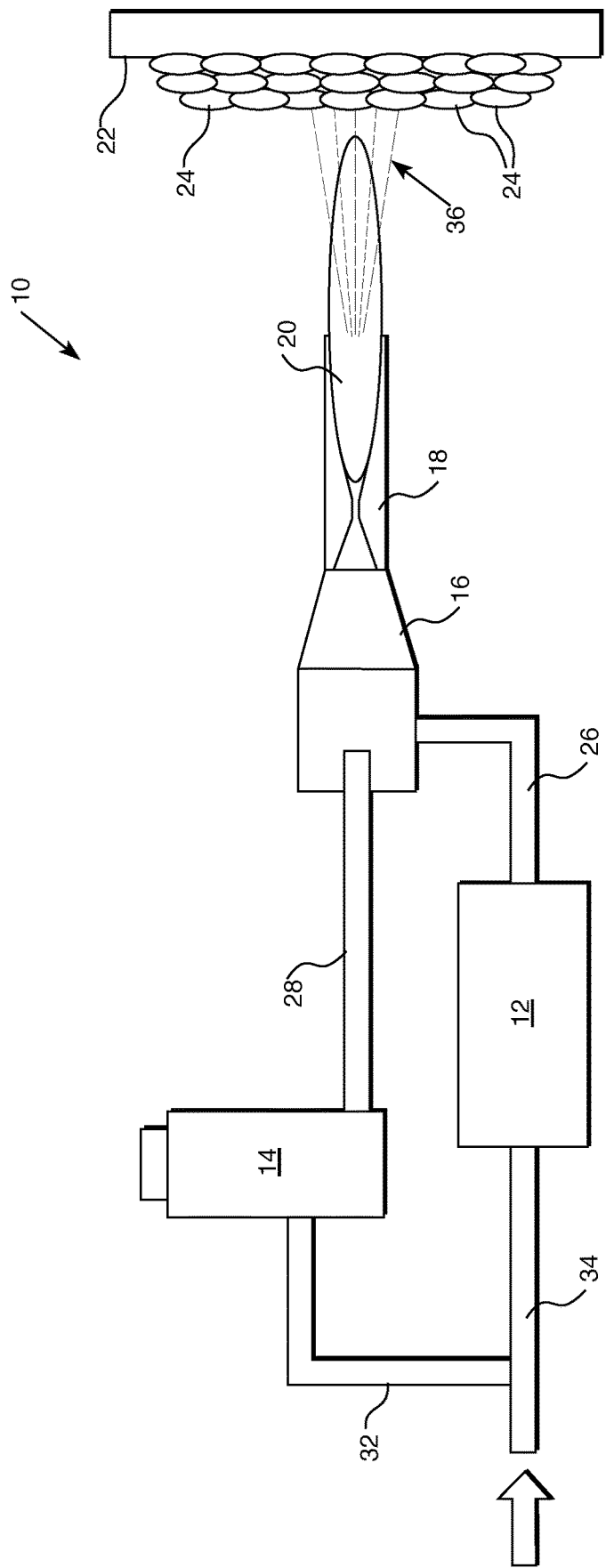

DUPLEX ACCIDENT TOLERANT COATING FOR NUCLEAR FUEL RODS

STATEMENT REGARDING GOVERNMENT RIGHTS

This invention was made with government support under Contract No. DE-NE0008222 awarded by the Department of Energy. The U.S. Government has certain rights in this invention.

BACKGROUND OF THE INVENTION

1. Field of the Invention

The invention relates to coatings for nuclear fuel rod cladding, and more particularly to the methods for depositing duplex protective layers on a zirconium alloy substrate.

2. Description of the Prior Art

Zirconium alloys rapidly react with steam at temperatures of 1100° C. and above to form zirconium oxide and hydrogen. In the environment of a nuclear reactor, the hydrogen produced from that reaction would dramatically pressurize the reactor and would eventually leak into the containment or reactor building leading to potentially explosive atmospheres and to potential hydrogen detonations, which could lead to fission product dispersion outside of the containment building. Maintaining the fission product boundary is of critical importance.

U.S. Patent Application US 2014/0254740 discloses efforts to apply metal oxides, ceramic materials, or metallic alloys that contain chromium to a zirconium alloy cladding tube using a thermal spray, such as a cold spray technique wherein powderized coating materials are deposited with substantial velocity on a substrate in order to plastically deform the particles into a flattened, interlocking material that forms a coating.

Metallic chromium is known to provide excellent corrosion resistance, but it is a hard and brittle metal that not been considered to be a good candidate for deposition by cold spray because of its lack of ductility and high melting point. Because of their corrosion resistance, chromium and chromium alloys have nonetheless been proposed for corrosion resistance.

The performance of these corrosion coatings is limited, however, when temperatures reach the eutectic range point.

SUMMARY OF THE INVENTION

The method described herein addresses the problem associated with the potential reaction of steam with zirconium in a nuclear reactor and the limitations that can be experienced when temperatures exceed the eutectic point for the alloys used. The method described herein provides a layer between a chromium or chromium alloy corrosion resistant layer and a substrate to avoid eutectic formation between the corrosion resistant layer and the substrate.

A method is provided for forming a corrosion resistant layer on a substrate of a component for use in a water cooled nuclear reactor. In various aspects, the method includes providing a substrate; forming on the exterior of the substrate an interlayer with particles, preferably transition metal particles, such as molybdenum (Mo), niobium (Nb), tantalum (Ta), tungsten (W) and other particles, each particle having a diameter of 100 microns or less; and forming a corrosion resistant layer on the interlayer with particles selected from the group consisting of Cr, a Cr alloy, and combinations thereof. The corrosion resistant layer particles may have a diameter of 100 microns or less.

The substrate is preferably a zirconium alloy and the component, in various aspects, may be a cladding tube for a nuclear fuel rod. The substrate may be any shape associated with the component to be coated. For example, the substrate may be cylindrical in shape, curved, or may be flat. In a nuclear fuel rod, the substrate is preferably cylindrical.

When the corrosion resistant layer particles are chromium-based alloys, they may comprise 80 to 99 atom % of chromium. In various aspects, the chromium-based alloy may include at least one element selected from the group consisting of silicon, yttrium, aluminum, titanium, niobium, zirconium, and transition metal elements, at a combined content of 0.1 to 20 atomic %. In various aspects, the Cr alloy may be one of FeCrAlY or FeCrAl.

The interlayer and the corrosion resistant layer may be formed by any suitable method. In various aspects, the layers are formed by a thermal deposition process, such as a cold spray process. When the interlayer deposition process is a cold spray process, the method may further include heating a pressurized carrier gas to a temperature between 200° C. and 1000° C.; adding the interlayer particles to the heated carrier gas; and spraying the carrier gas and entrained particles at a velocity of 800 to 4000 ft./sec. (about 243.84 to 1219.20 meters/sec.) onto the substrate.

When the corrosion resistant layer deposition process is a cold spray process, the method may further include heating a pressurized carrier gas to a temperature between 200° C. and 1000° C.; adding the Cr or Cr alloy particles to the heated carrier gas; and spraying the carrier gas and entrained Cr or Cr alloy particles at a velocity of 800 to 4000 ft./sec. (about 243.84 to 1219.20 meters/sec.) onto the interlayer.

The carrier gas is advantageously selected from inert and unreactive gases. In various aspects, the carrier gas may be selected from the group consisting of nitrogen, hydrogen, argon, carbon dioxide, helium, and combinations thereof. The carrier gas may be heated at a pressure up to 5.0 MPa.

The carrier gas and particles are preferably sprayed continuously at very high rates until the desired coating thickness is reached. The coating thickness may, for example, be between 5 and 100 microns, but greater thicknesses of, for example, several hundred microns, may be deposited.

In various aspects, the interlayer and the corrosion resistant layer are formed by a physical vapor deposition process. The physical vapor deposition process may be any suitable known process, such as a cathodic arc vapor deposition, magnetron sputtering deposition, or pulsed laser deposition.

In various aspects of the method, one of the interlayer and the corrosion resistant layer is formed by a thermal deposition process and the other the interlayer and the corrosion resistant layer is formed by a physical vapor deposition process.

Following formation of the interlayer and the corrosion resistant layer, the method may further include annealing the coating. Annealing may impart ductility and may create sub-micron sized grains that, it is believed, will be beneficial for isotropy in properties and resistance to radiation damage.

The method described herein provides in various aspects, a cladding tube formed from a zirconium alloy and having an interlayer coating and an outer coating formed from chromium or a chromium alloy. In general, the interlayer material may be chosen from those materials having a eutectic melting point with the zirconium or zirconium alloys that is in various aspects, above 1400° C., and preferably in certain aspects, above 1500° C., and may in addition, be chosen from those materials having thermal expansion coefficients and elastic modulus coefficients compatible with the zirconium or zirconium alloy on which it is coated and the coating which is applied above it. Examples include transition metals such as Mo or other metals such as Nb, Ta, and W that have a high melting point (greater than 1700° C.) and do not form a eutectic or metals that do form a eutectic but at higher temperatures (greater than 1400° C.) than the eutectic that may be formed between the zirconium alloy tube and an outer coating formed from chromium or a chromium alloy (around 1333° C.).

In various aspects, the corrosion resistant layer acts as a corrosion barrier for the substrate. When the substrate is a zirconium alloy cladding, the chromium coating provides a barrier against corrosion at normal operating conditions, for example, between 270° C. and 350° C. in pressurized water reactors and between 200° C. and 300° C. in boiling water reactors. The coating reduces the steam zirconium and air zirconium reactions and hydrogen generation at high temperatures, i.e., those greater than 1100° C.

The interlayer is introduced to mitigate eutectic formation between the corrosion resistant layer and the substrate that limits the performance of the corrosion resistant layer at temperature higher than, for example, 900° C., for Zr or Zr alloy and Cr or Cr alloy materials, such as FeCrAl or FeCrAlY, and thus improves the accident tolerance of this embodiment of a corrosion resistant layer at temperatures higher than 900° C.

BRIEF DESCRIPTION OF THE DRAWINGS

The characteristics and advantages of the present disclosure may be better understood by reference to the accompanying FIGURE.

FIG. 1 is a schematic illustration of a cold spray process.

DESCRIPTION OF THE PREFERRED EMBODIMENTS

As used herein, the singular form of "a", "an", and "the" include the plural references unless the context clearly dictates otherwise. Thus, the articles "a" and "an" are used herein to refer to one or to more than one (i.e., to at least one) of the grammatical object of the article. By way of example, "an element" means one element or more than one element.

Directional phrases used herein, such as, for example and without limitation, top, bottom, left, right, lower, upper, front, back, and variations thereof, shall relate to the orientation of the elements shown in the accompanying drawing and are not limiting upon the claims unless otherwise expressly stated.

In the present application, including the claims, other than where otherwise indicated, all numbers expressing quantities, values or characteristics are to be understood as being modified in all instances by the term "about." Thus, numbers may be read as if preceded by the word "about" even though the term "about" may not expressly appear with the number. Accordingly, unless indicated to the contrary, any numerical parameters set forth in the following description may vary depending on the desired properties one seeks to obtain in the compositions and methods according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Further, any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

"Pure Cr", or "pure chromium", as used herein, means 100% metallic chromium that may include trace amounts of unintended impurities that do not serve any metallurgical function. For example, pure Cr may contain a few ppm of oxygen. "Cr-alloy," "chromium alloy," "Cr-based alloy," or "chromium-based alloy" as used herein refer to alloys with Cr as the dominant or majority element together with small but reasonable amounts of other elements that serve a specific function. The Cr alloy may comprise 80% to 99 atom % of chromium. Other element in the Cr alloy may include at least one chemical element selected from silicon, yttrium, aluminum, titanium, niobium, zirconium, and other transition metal elements. Such elements may be present for example at a content of 0.1 atomic % to 20 atomic %.

A method is described herein for improving the corrosion resistance of a substrate, by adding a layer of a material between the substrate and the corrosion resistant layer that mitigates eutectic formation between the corrosion resistant layer and the substrate at temperature higher than the eutectic point of the materials. For example, when the substrate is Zr or a Zr alloy and the corrosion resistant layer is Cr or a Cr alloy or Cr based alloy, such as FeCrAl, the interlayer mitigates eutectic formation at temperatures higher than 900° C.

The duplex structure of a cladding tube described herein, with the addition of an interlayer between the substrate and the corrosion resistant layer improves the accident tolerance of, for example, a coated zirconium alloy cladding at high temperatures so that eutectic formation between the corrosion resistance layer and the zirconium alloy substrate can be avoided.

A method is described herein of coating a substrate with at least two layers for use in a nuclear water reactor, and of a cladding tube comprising a substrate and at least two layers applied on the exterior thereof, having an outer layer providing corrosion resistance and an inner layer that prevents eutectic formation at high temperatures. In various aspects, the outer layer comprises Cr or a Cr alloy, such as FeCrAlY, and the inner layer comprises a transition metal, such as Mo, Nb, Ta, or W. Both layers can be applied using a thermal deposition process, such as a cold spray process. Alternatively, both layers can be applied using a physical vapor deposition (PVD) process, such as cathodic arc physical vapor deposition, magnetron sputtering, or pulse laser deposition (PLD). The inner layer will be deposited first and may be ground and polished before deposition of the outer layer, which can be ground and polished thereafter.

The improved coating method described herein improves the integrity of the cladding tube coating under high temperature accident conditions and equally as important, under normal operating conditions. Even under normal operating conditions hydrogen may form due to Zr oxidation or may be present in water. This hydrogen diffuses into the Zr-cladding (called hydriding) and causes brittleness in the cladding. The improved duplex coated cladding tube will be less susceptible to hydriding of Zr-cladding which would contribute to increased cycle length, and thus, improve the economics of operating the reactor. The duplex coated cladding tube is also expected to resist delayed hydride cracking, so it would perform better in subsequent dry cask storage.

In various aspects, the Cr or Cr-based alloy coating provided by the method described herein will reduce hydriding by way of reduced oxidation and by acting as a diffusion barrier to hydrogen in the water from entering the cladding. There are important benefits to having such a Cr coating even under normal conditions, but the role of the Cr or Cr-based coating becomes indispensable during higher temperature accident conditions.

Cr exhibits negligible thermal diffusion into the underlying Zr under normal operating conditions and even at temperatures up to 650° C. Despite the intimate contact between the coating and the substrate induced by cold spray there is only very limited inter-diffusion between the pure Cr coating and the substrate at 1200° C. It is believed that in fact, the slight thermal diffusion that occurs under accident temperatures may be beneficial in keeping the coating anchored to the substrate.

The benefits of the corrosion resistant coating are improved further by the addition of an interlayer between the corrosion resistant coating layer and the substrate. As explained above, the interlayer further improves the accident tolerance of the coated zirconium alloy cladding by avoidance of eutectic formation between the corrosion resistance layer and the zirconium alloy substrate at eutectic temperatures. The exact temperature will vary depending on the materials used for the substrate and the corrosion resistant layer. Eutectic phase diagrams for determining the eutectic point are readily available in the literature.

In various embodiments, the method proceeds by delivering a carrier gas to a heater where the carrier gas is heated to a temperature sufficient to maintain the gas at a reasonable temperature (e.g., 100° C. to 500° C.) after expansion in the gas delivery nozzle. The expansion of the gas propels the particles. In various aspects, the carrier gas may be heated to a temperature between 100° C. and 1200° C., with a pressure, for example, of 5.0 MPa. In certain aspects, the carrier gas may be heated to a temperature between 200° C. and 800° C. In certain aspects, the carrier gas may be heated to between 300° C. and 800° C. and in other aspects, may be heated to a temperature between 500° C. and 800° C. The temperature to which the gas is preheated depends on the gas used as the carrier and on the Joule-Thomson cooling coefficient of the particular gas. Whether or not a gas cools upon expansion or compression when subjected to pressure changes depends on the value of its Joule-Thomson coefficient. For positive Joule-Thomson coefficients, the carrier gas cools and must be preheated to prevent excessive cooling which can affect the performance of the cold spray process. Those skilled in the art can determine the degree of heating using well known calculations to prevent excessive cooling. See, for example, for $N_2$ as a carrier gas, if the inlet temperature is 130° C., the Joule-Thomson coefficient is 0.1° C./bar. For the gas to impact the tube at 130° C. if its initial pressure is 10 bar (~146.9 psia) and the final pressure is 1 bar (~14.69 psia), then the gas needs to be preheated to about 9 bar*0.1° C./bar or about 0.9° C. to about 130.9° C.

For example, the temperature for helium gas as the carrier is preferably 450° C. at a pressure of 3.0 to 4.0 MPa, and the temperature for nitrogen as the carrier may be 1100° C. at a pressure of 5.0 MPa, but may also be 600° C.-800° C. at a pressure of 3.0 to 4.0 MPa. Those skilled in the art will recognize that the temperature and pressure variables may change depending on the type of the equipment used and that equipment can be modified to adjust the temperature, pressure and volume parameters.

Suitable carrier gases are those that are inert or are not reactive, and those that particularly will not react with the interlayer particles, the Cr or Cr-based alloy corrosion resistant layer particles or the substrate. Exemplary carrier gases include nitrogen ($N_2$), hydrogen ($H_2$), argon (Ar), carbon dioxide ($CO_2$), and helium (He). There is considerable flexibility in regard to the selected carrier gases. Mixtures of gases may be used. Selection is driven by both physics and economics. For example, lower molecular weight gases provide higher velocities, but in certain aspects, the highest velocities should be avoided as they could lead to a rebound of particles and therefore diminish the number of deposited particles.

In various aspects, one or both layers may be applied using a thermal deposition process. For example, the process may be conducted in an assembly such as that shown in FIG. 1. Referring to FIG. 1, a cold spray assembly 10 is shown. Assembly 10 includes a heater 12, a powder or particle hopper 14, a gun 16, nozzle 18 and delivery conduits 34, 26, 32 and 28. High pressure gas enters conduit 34 for delivery to heater 12, where heating occurs quickly; substantially instantaneously. When heated to the desired temperature, the gas is directed through conduit 26 to gun 16. Particles held in hopper 14 are released and directed to gun 16 through conduit 28 where they are forced through nozzle 18 towards the substrate 22 by the pressurized gas jet 20. To form the interlayer, the sprayed particles 24 are deposited onto substrate 22 to form interlayer 30 comprised of particles 24.

In general, the interlayer material may be chosen from those materials having a eutectic melting point with the zirconium or zirconium alloys that is above 1400° C. and thermal expansion coefficients and elastic modulus coefficients compatible with the zirconium or zirconium alloy on which it is coated and the coating which is applied above it. The particles used to form the interlayer may be Mo, but alternatively Ta, W or Nb particles, all of which form eutectics with Zr or Zr alloys greater than 1400° C., and in various aspects, greater than 1500° C.

In certain aspects, the particles used to form the interlayer may be Mo particles. Mo particles (or any of the other suitable interlayer particles) are added to hopper 14. The interlayer particles 24 become entrained in the carrier gas when brought together in gun 16. The nozzle 18 narrows to force the particles and gas together and to increase the velocity of the gas jet 20 exiting nozzle 18. The particles are sprayed onto the substrate at a velocity sufficient to provide a compact, impervious, or substantially impervious layer. In various aspects the velocity of the jet spray may be from 800 to 4000 ft./sec. (about 243.84 to 1219.20 meters/sec.).

The interlayer may be ground and polished before deposition of the outer, corrosion resistant layer, which can be ground and polished thereafter.

The cold spray process relies on the controlled expansion of the heated carrier gas to propel the particles onto the substrate. The particles impact the substrate or a previous deposited layer and undergo plastic deformation through adiabatic shear. Subsequent particle impacts build up to form the coating. The particles may also be warmed to temperatures one-third to one-half the melting point of powder expressed in degrees Kelvin before entering the flowing carrier gas in order to promote deformation. The nozzle is rastered (i.e., sprayed in a pattern in which an area is sprayed from side to side in lines from top to bottom) across the area to be coated or where material buildup is needed.

Coating tubular geometries, rather than just flat surfaces, has heretofore been challenging. Whereas flat surfaces can readily be coated, tubular and other curved surfaces have been economically challenging. Coating a tubular or cylindrical geometry requires the tube be rotated as the nozzle moves lengthwise across the tube or cylinder. The nozzle traverse speed and tube rotation are in synchronized motion so that uniform coverage is achieved. The rate of rotation and speed of traverse can vary substantially as long as the movement is synchronized for uniform coverage. The tube may require some surface preparation such as grinding or chemical cleaning to remove surface contamination to improve adherence and distribution of the coating.

In various aspects of the method, the particles used for the corrosion resistant layer are pure metallic chromium particles that have an average diameter of less than 20 microns. By "average diameter," as used herein, those skilled in the art will recognize that the particles may be both spherical and non-spherical so that the "diameter" will be the longest dimension of the regularly or irregularly shaped particles, and the average diameter means that there will be some variation in the largest dimension of any given particle above or below 20 microns, but the average of the longest dimension of all particles used in the coating are together, 20 microns or less.

The chromium or chromium-based alloy particles are solid particles. Following application of the interlayer 30, the corrosion resistant layer is applied. If cold spray is used to apply this outer layer, the chromium or chromium alloy particles 36 or a combination thereof, are added to the hopper 14 in place of, for example, the Mo particles, or a separate assembly with its own chamber and a separate hopper for application of the corrosion resistant layer may be used. The chromium or chromium alloy particles 36 become entrained in the carrier gas when brought together in gun 16. The nozzle 18 narrows to force the particles and gas together and to increase the velocity of the gas jet 20 exiting nozzle 18. The particles 36 are sprayed at a velocity sufficient to provide a compact, impervious, or substantially impervious, Cr and/or Cr-based alloy layers. In various aspects the velocity of the jet spray may be from 800 to 4000 ft./sec. (about 243.84 to 1219.20 meters/sec.). The particles 36 are deposited onto the surface of the interlayer 30 at a rate sufficient to provide the desired production rate of coated tubing, at a commercial or research level.

The rate of particle deposition for either of the layers depends on the powder apparent density (i.e., the amount of powder vs. the air or empty space in a specific volume) and the mechanical powder feeder or hopper used to inject the powder particles into the gas stream. Those skilled in the art can readily calculate the rate of deposition based on the equipment used in the process, and can adjust the rate of deposition by altering the components that factor into the rate. In certain aspects of the method, the rate of particle deposition may be up to 1000 kg/hour. An acceptable rate is between 1 and 100 kg/hour, and in various aspects, between 10 and 100 kg/hour, but higher and lower rates, such as 1.5 kg/hour, have been successfully used.

The rate of deposition is important from the standpoint of economics when more tubes can be sprayed per unit of time at higher deposition rates. The repetitive hammering of particles one after the other has a beneficial effect on improving intraparticle bonding (and particle-substrate bonding) because of the longer duration of transient heating. Transient heating occurs over micro- or even nano-second time scale and over nanometer length scales. It can also result in in the fragmentation and removal of nanometer thickness oxide layers that are inherently present on all powder and substrate surfaces. The spray continues until a desired thickness of the interlayer on the substrate surface or the corrosion resistant layer on the interlayer is reached. In various aspects, a desired thickness for the corrosion resistant layer may be several hundred microns, for example, from 100 to 300 microns, or may be thinner, for example, from 5 to 100 microns. The corrosion resistant layer coating should be thick enough to form a barrier against corrosion. The coating barrier reduces, and in various aspects may eliminate, any steam zirconium and air zirconium reactions, and reduces, and in various aspects eliminates, zirconium hydride formation at temperatures of about 1000° C. and above.

In various aspects, a method of forming a corrosion resistant layer on the interlayer comprises providing a zirconium alloy substrate, and coating the substrate to a desired thickness with particles selected from Mo, Ta, W, or Nb particles, followed by coating the interlayer with particles selected from the group consisting of Cr and a Cr alloy, such as FeCrAl or FeCrAlY. The particles of each layer have an average diameter of less than 20 microns and a maximum particle size of 100 microns.

In various aspects, the duplex accident tolerant coating may comprise an outer corrosion resistant layer of Cr or a Cr alloy and inner layer of particles selected from Mo, Ta, W, or Nb. The layers are applied to zirconium alloy tubes to reduce the reaction of zirconium with steam or air at both normal operating conditions and accident conditions. The two layers of coatings can be applied using cold spray in sequence, as described above, and the parameters are established utilizing a carrier gas to apply the particles with a size of preferably less than about 20 microns average diameter but up to 100 microns in diameter, for a coating of from 5 to 100 microns.

As stated, particles may be applied by a thermal deposition process. Thermal evaporation is a deposition technique that relies on vaporization of source material by heating the material using appropriate methods in vacuum. The cold spray process described herein is exemplary.

In various alternative aspects, the two layers of coatings can also be applied using a type of physical vapor deposition method such as cathodic arc physical vapor deposition, magnetron sputtering, or pulse laser deposition.

Several physical vapor deposition (PVD) processes are known in the art for depositing thin layers of materials, such as particles, to a substrate and may be used to apply one or both of the interlayer and the corrosion resistant layer. PVD may be characterized as a collective set of vacuum deposition techniques consisting of three fundamental steps: (1) vaporization of the material from a solid source assisted by high temperature vacuum or gaseous plasma; (2) transportation of the vapor in vacuum or partial vacuum to the substrate surface; and, (3) condensation onto the substrate to generate thin films.

The most common of the PVD coating processes are evaporation (typically using cathodic arc or electron beam sources), and sputtering (using magnetic enhanced sources or "magnetrons", cylindrical or hollow cathode sources). All of these processes occur in vacuum at working pressure (typically $10^{-2}$ to $10^{-4}$ mbar) and generally involve bombardment of the substrate to be coated with energetic positively charged ions during the coating process to promote high density. Additionally, reactive gases may be introduced into the vacuum chamber during metal deposition to create various compound coating compositions. The result is a very strong bond between the coating and the substrate and tailored physical and properties of the deposited layer.

Cathodic arc vapor deposition involves a source material and a substrate to be coated placed in an evacuated deposition chamber. The chamber contains only a relatively small amount of gas. The negative lead of a direct current (DC) power supply is attached to the source material (the "cathode") and the positive lead is attached to an anode. In many cases, the positive lead is attached to the deposition chamber, thereby making the chamber the anode. The electric arc is used to vaporize material from the cathode target. The vaporized material then condenses on the substrate, forming the desired layer.

Magnetron Sputtering is a plasma vapor deposition process in which a plasma is created and positively charged ions from the plasma are accelerated by an electrical field superimposed on the negatively charged electrode or "target". The positive ions are accelerated by potentials ranging from a few hundred to a few thousand electron volts and strike the negative electrode with sufficient force to dislodge and eject atoms from the target. These atoms will be ejected in a typical line-of-sight cosine distribution from the face of the target and will condense on surfaces that are placed in proximity to the magnetron sputtering cathode.

Pulsed laser deposition (PLD) is a physical vapor deposition technique where a high-power pulsed laser beam is focused inside a vacuum chamber to strike a target of the material that is to be deposited. This material is vaporized from the target (in a plasma plume) which deposits it as a thin film on a substrate. The process of PLD can generally be divided into five stages: (1) laser absorption on the target surface; (2) laser ablation of the target material and creation of a plasma; (3) dynamic of the plasma; (4) deposition of the ablation material on the substrate; and (5) nucleation and growth of the film on the substrate surface.

Following the deposition of the corrosion resistant layer onto the interlayer, the method may further include annealing the corrosion resistant layer. Annealing modifies mechanical properties and microstructure of the coated tube. Annealing involves heating the coating in the temperature range of 200° C. to 800° C., and preferably between 350° C. to 550° C. It relieves the stresses in the coating and imparts ductility to the coating which is necessary to sustain internal pressure in the cladding. As the tube bulges, the coating should also be able to bulge. Another important effect of annealing is the deformed grains formed for example during cold spray process get recrystallized to form fine sub-micron sized equiaxed grains which may be beneficial for isotropic properties and radiation damage resistance.

Annealing following for example the cold spray deposition of the corrosion resistant layer results in structures that are rather unique to cold spray coatings. This is very beneficial to achieving higher ductility, to better sustain tube bursts, as shown in testing, and is believed to be beneficial for radiation damage resistance. The coatings provided by the method described herein create the initial structure for giving rise to fine equiaxed grains.

The duplex coated substrate may also be ground, buffed, polished, or treated by other known techniques to achieve a smoother surface finish.

The method as described herein produces a duplex coated substrate. In an exemplary embodiment, the method produces a cladding tube for use in a water cooled nuclear reactor. The cladding tube may be formed from a zirconium alloy. The cladding tube described herein may comprise in various aspects, a zirconium alloy substrate having an inner coating formed from Mo or alternatively Ta, W or Nb, and an outer coating formed from chromium or a chromium alloy.

The inner and outer coatings may be a desired thickness. In various aspects, the thickness of the coating may be about 100 to 300 microns or more. Thinner coatings from about 50 to 100 microns thick may also be applied. In various aspects, the coatings may be up to 100 microns thick. In various aspects, the coatings may each be from 20 to 50 microns thick. The Cr alloy may be, for example, FeCrAl or FeCrAlY.

All patents, patent applications, publications, or other disclosure material mentioned herein, are hereby incorporated by reference in their entirety, except that all references, and any material, or portion thereof, that are said to be incorporated by reference herein are incorporated herein only to the extent that the incorporated material does not conflict with existing definitions, statements, or other disclosure material expressly set forth in this disclosure. As such, and to the extent necessary, the disclosure as set forth herein supersedes any conflicting material incorporated herein by reference and the disclosure expressly set forth in the present application controls.

The present invention has been described with reference to various exemplary and illustrative embodiments. The embodiments described herein are understood as providing illustrative features of varying detail of various embodiments of the disclosed invention; and therefore, unless otherwise specified, it is to be understood that, to the extent possible, one or more features, elements, components, constituents, ingredients, structures, modules, and/or aspects of the disclosed embodiments may be combined, separated, interchanged, and/or rearranged with or relative to one or more other features, elements, components, constituents, ingredients, structures, modules, and/or aspects of the disclosed embodiments without departing from the scope of the disclosed invention. Accordingly, it will be recognized by persons having ordinary skill in the art that various substitutions, modifications or combinations of any of the exemplary embodiments may be made without departing from the scope of the invention. In addition, persons skilled in the art will recognize, or be able to ascertain using no more than routine experimentation, many equivalents to the various embodiments of the invention described herein upon review of this specification. Thus, the invention is not limited by the description of the various embodiments, but rather by the claims.

What is claimed is:

1. A method of forming a corrosion resistant boundary on a substrate of a component for use in a water cooled nuclear reactor, the method comprising:
   providing a zirconium alloy substrate;
   forming on the zirconium alloy substrate, an interlayer with particles selected from the group consisting of Mo, Ta, W, and Nb; and
   forming a corrosion resistant layer on the interlayer with particles selected from the group consisting of Cr, a Cr alloy, and combinations thereof;
   wherein the interlayer is formed by a physical vapor deposition process and the corrosion resistant layer is formed by a cold spray thermal deposition process.

2. The method recited in claim 1 wherein Cr alloy of the corrosion resistant layer comprises one of FeCrAl or FeCrAlY.

3. The method recited in claim 1 wherein the cold spray process comprises:

heating a pressurized carrier gas to a temperature between 100° C. and 1200° C.;

adding the particles to the heated carrier gas; and spraying the carrier gas and entrained particles at a velocity of 800 to 4000 ft./sec. (about 243.84 to 1219.20 meters/sec.).

4. The method recited in claim 3 wherein the carrier gas is selected from the group consisting of nitrogen ($N_2$), hydrogen ($H_2$), argon (Ar), carbon dioxide ($CO_2$), and helium (He) and combinations thereof.

5. The method recited in claim 1 wherein the physical vapor deposition process is selected from the group consisting of cathodic arc vapor deposition, magnetron sputtering deposition, and pulsed laser deposition.

6. The method recited in claim 1 further comprising, following the formation of the interlayer, at least one of grinding, buffing, and polishing to increase the smoothness of the coating.

7. The method recited in claim 1 further comprising, following the formation of the corrosion resistant layer, at least one of grinding, buffing, and polishing to increase the smoothness of the coating.

8. The method recited in claim 1 wherein the particles forming the corrosion resistant layer are pure chromium particles.

9. The method recited in claim 1 wherein the particles forming the corrosion resistant layer are Cr alloy particles.

10. The method recited in claim 1 wherein the particles forming the corrosion resistant layer are selected from the group consisting of FeCrAl and FeCrAlY particles.

11. The method recited in claim 1 wherein the particles forming the interlayer are Mo particles.

12. The method of claim 1, wherein the thickness of the interlayer is between 100 and 300 microns and the thickness of the corrosion resistant layer is between 100 and 300 microns.

13. A method of forming a corrosion resistant boundary on a substrate of a component for use in a water cooled nuclear reactor, the method comprising:

providing a zirconium alloy substrate;

forming on the zirconium alloy substrate, an interlayer with particles selected from the group consisting of Mo, Ta, W, and Nb; and forming a corrosion resistant layer on the interlayer with particles selected from the group consisting of Cr, a Cr alloy, and combinations thereof;

wherein the interlayer is formed by a cold spray thermal deposition process and the corrosion resistant layer is formed by physical vapor deposition.

* * * * *